United States Patent
Maddali et al.

(10) Patent No.: US 7,746,038 B2
(45) Date of Patent: Jun. 29, 2010

(54) SYSTEM AND METHOD FOR SUPPRESSING DC LINK VOLTAGE BUILDUP DUE TO GENERATOR ARMATURE REACTION

(75) Inventors: Vijay K. Maddali, Rockford, IL (US); John F. Defenbaugh, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 352 days.

(21) Appl. No.: 12/006,430

(22) Filed: Jan. 2, 2008

(65) Prior Publication Data
US 2009/0167256 A1    Jul. 2, 2009

(51) Int. Cl.
H02P 9/10 (2006.01)
H02P 9/14 (2006.01)
H02P 27/04 (2006.01)
H02P 3/18 (2006.01)
H02P 21/05 (2006.01)
G05B 5/01 (2006.01)

(52) U.S. Cl. .................. 322/63; 318/616; 318/702; 318/758; 318/802; 318/803

(58) Field of Classification Search .............. 322/63; 318/616, 702, 758, 802, 803, 140–158
See application file for complete search history.

(56) References Cited

U.S. PATENT DOCUMENTS

| | | | | |
|---|---|---|---|---|
| 3,919,609 A * | 11/1975 | Klautschek et al. | ......... | 318/803 |
| 4,044,284 A * | 8/1977 | Plunkett et al. | ............. | 318/803 |
| 4,088,934 A * | 5/1978 | D'Atre et al. | ............... | 318/802 |
| 4,088,935 A * | 5/1978 | D'Atre et al. | ............... | 318/802 |
| 4,156,169 A * | 5/1979 | Imamura | .................... | 318/616 |
| 4,215,304 A * | 7/1980 | D'Atre et al. | ............... | 318/758 |
| 4,215,305 A * | 7/1980 | D'Atre et al. | ............... | 318/803 |
| 4,243,927 A * | 1/1981 | D'Atre | ........................ | 318/803 |
| 4,418,308 A * | 11/1983 | Bose | ........................... | 318/803 |
| 5,428,275 A * | 6/1995 | Carr et al. | .................... | 318/146 |
| 7,119,472 B2 | 10/2006 | Lacaze | ........................ | 310/183 |
| 7,593,243 B2 * | 9/2009 | Ganev et al. | ................... | 363/44 |
| 2004/0081099 A1 * | 4/2004 | Patterson et al. | ............ | 370/241 |
| 2008/0030178 A1 * | 2/2008 | Leonard et al. | ............ | 323/282 |
| 2008/0084716 A1 * | 4/2008 | Ganev et al. | ................... | 363/39 |
| 2009/0009129 A1 * | 1/2009 | Markunas et al. | ........... | 318/702 |
| 2009/0021208 A1 * | 1/2009 | Romenesko et al. | ......... | 318/807 |
| 2009/0167257 A1 * | 7/2009 | Maddali et al. | ............... | 322/28 |

* cited by examiner

Primary Examiner—T C Patel
Assistant Examiner—Pedro J Cuevas
(74) Attorney, Agent, or Firm—Kinney & Lange, P.A.

(57) ABSTRACT

A controller employed in conjunction with a synchronous generator monitors the output voltage of the generator. The controller employs the monitored output voltage as feedback that is used to control the excitation provided to an exciter field winding. In addition, the controller applies a control loop to the monitored output voltage that detects and modifies voltage ripple signals within the monitored output voltage to generate a compensated signal that is used to control the excitation to the exciter field winding. In particular, by detecting and modifying voltage ripple signals within the monitored output voltage, the controller is able to counteract armature reaction voltage ripples caused by unbalanced short-circuit faults, thereby preventing the build-up of voltage on the DC link.

21 Claims, 3 Drawing Sheets

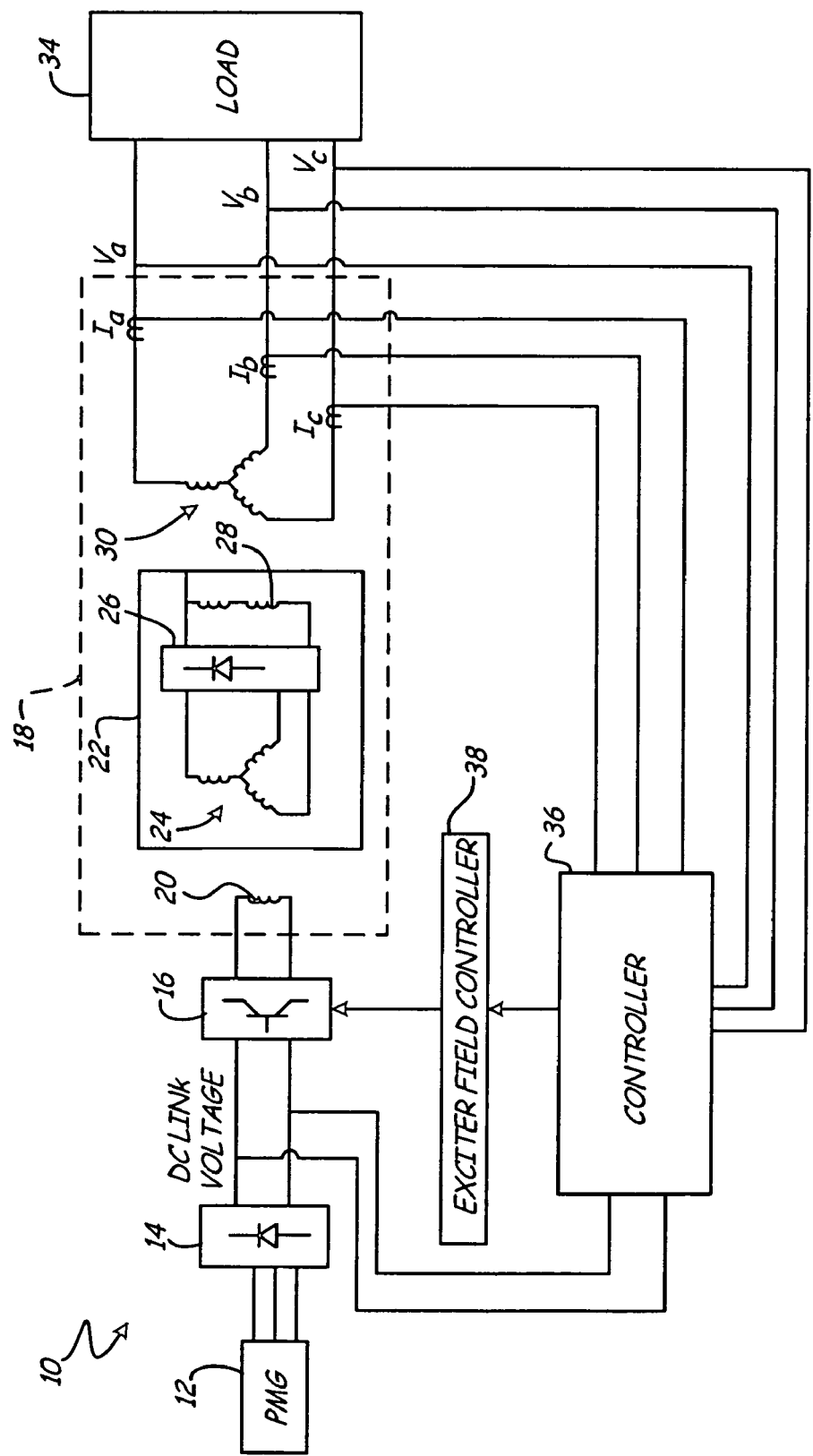

SYSTEM AND METHOD FOR SUPPRESSING DC LINK VOLTAGE BUILDUP DUE TO GENERATOR ARMATURE REACTION

BACKGROUND

The present invention is related to generators and in particular to control schemes for suppressing DC link voltage build-up in, generators due to unbalanced short circuit conditions.

In synchronous generators, the generation of an alternating current (AC) output voltage is controlled based on the magnitude of an exciter current provided as an input to an exciter field winding. For instance, in a common configuration, a permanent magnet generator and a rectifier circuit are used to provide a DC link voltage. In turn, the DC link voltage is employed to provide a DC current of a desired magnitude to the exciter field winding. An AC voltage induced in the exciter rotor windings is converted to a DC voltage by a rotating rectifier circuit and provided as excitation to a main field winding. In response to the DC excitation in the main field winding, an AC output voltage is generated in the main armature winding that is then provided to a load. In addition, the output voltage and/or output current of the generator are provided as feedback to a controller that controls the magnitude of the DC current provided to the exciter field winding. In, this way, the output voltage of the generator is maintained at a desired magnitude.

To detect potentially fatal errors (e.g., diode faults in the rotating rectifier), the controller may also monitor the DC link voltage. In response to, an increase, in the magnitude of the DC link voltage, the controller orders a shutdown of the generator. However, problems arise when unbalanced short circuit faults at the output of the generator are transmitted through armature reaction to the DC link voltage. The unbalanced short-circuit fault results in the magnitude of the DC link voltage increasing such that a shutdown of the generator is triggered by a condition in which it is preferable to maintain the operation of the generator. It would therefore be beneficial to prevent the buildup of DC link voltage in response to an unbalanced short-circuit fault to prevent the improper shutdown of the generator.

SUMMARY

Described herein is a controller for use in a synchronous generator system that includes an exciter field winding, an exciter armature winding, a main field winding, and a main armature winding. The controller includes a first input operably connected to monitor the output voltage of the synchronous generator and a voltage calculator operably connected to the first inputs to calculate a value representative of the average output voltage. In addition, the controller includes a compensation loop operably connected to the voltage calculator that detects voltage ripples, if any, in the average output voltage and modifies the shape of the voltage ripple to generate a compensated signal. The controller further includes an output operably connected to control the excitation provided to the exciter field winding based on the compensated signal. Proper shaping of the voltage ripple by the control loop results in a compensated signal that will counteract armature reaction voltage ripple generated as a result of an unbalanced short-circuit fault, thereby preventing the build-up of voltage on the DC link.

BRIEF DESCRIPTION OF THE DRAWINGS

FIG. 1 is a block diagram of a simplified generator system.

DETAILED DESCRIPTION

Figure 2A:
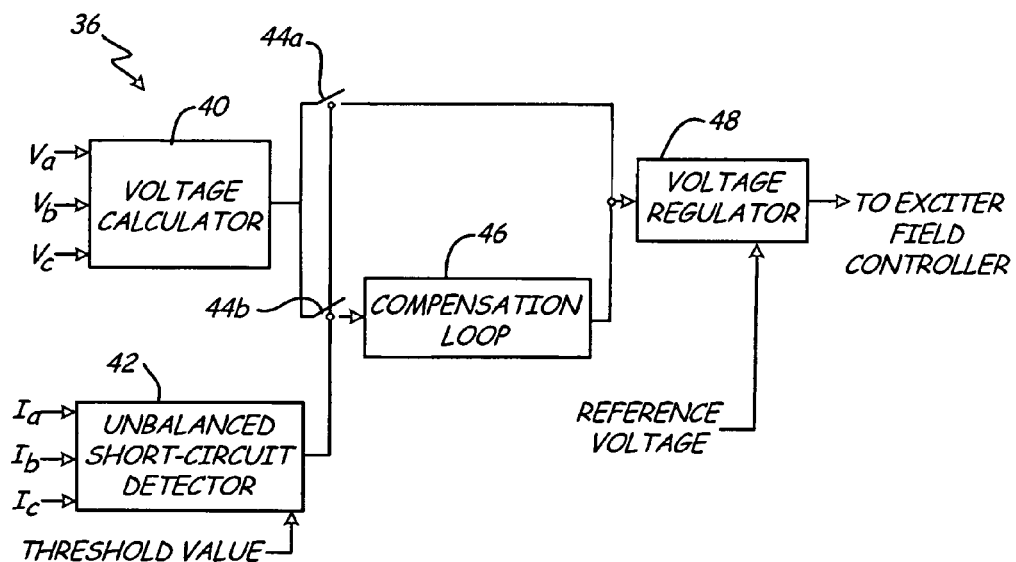
FIGS. 2A and 2B, are block diagrams illustrating an exemplary embodiment of the controller of the present invention.

FIG. 1 is a block diagram of simplified generator system 10 of the present invention, which includes permanent magnet generator (PMG) 12, rectifier circuit 14, active switch circuit 16, and generator 18. As shown in FIG. 1, generator 18 includes exciter field winding 20, rotating module 22, exciter armature winding 24, rotating rectifier 26, main field winding 28, and main armature winding 30. In addition, generator system 10 includes controller 36 and exciter field controller 38.

During operation a rotating shaft (not shown) provides mechanical energy to PMG 12 and rotating module 22. The mechanical energy provided to PMG 12 is converted to alternating current (AC) voltage. Rectifier circuit 14 converts the AC voltage to a direct current (DC) voltage that is provided to active switch circuit 16. This DC voltage is commonly referred to as the DC link voltage. Controller 36 and exciter current loop 38, based on feedback received at the output of main generator 30, provide pulse width modulated (PWM) control signals to switch circuit 16 to control the DC current (commonly referred to as the exciter field current) provided to exciter field winding 20. Based on the magnitude of the DC current provided to exciter field windings 20, the magnitude of the AC output voltage provided to load 34 can be controlled.

The DC voltage provided to exciter field winding 20 induces an AC voltage in exciter armature windings 24. In turn, the AC voltage generated in exciter armature windings 24 is rectified and provided to main field winding 28. An AC output voltage induced in main armature windings 30 is then provided to load 34. In addition, controller 36 monitors the output voltage of generator 18 and adjusts the excitation provided to exciter field windings 20 to control the generator output voltage as desired. In particular, controller 36 typically converts the monitored AC output voltage to a steady-state or DC representation of the output voltage. The steady-state value is compared to a reference value and based on the difference or error between these values, controller 36 causes exciter current loop 38 to selectively increase or decrease the excitation provided to exciter field winding 20. In this way, the AC output voltage generated by generator 10 is controlled to a desired value.

A problem arises in generator 10, however, with respect to the handling of different fault conditions. For example, diode faults, within rotating rectifier 26 are detected by monitoring a sudden build-up in the magnitude of the DC link voltage. To prevent damage to generating system 10 (e.g., such as to active switch circuit 16) caused by the sudden increase in DC link voltage, controller 36 causes generating system 10 to shutdown (i.e., by reducing or preventing the flow of the exciter field current). In this way, damage to generating system 10 is avoided by the correct handling of a fault in rotating rectifier 26. However, another type of fault known as a line-to-line, line-to-line-to-neutral fault or line-to-neutral fault on the output of generator 18 causes a similar increase in the DC link voltage. An unbalanced fault such as a line-to-line fault, line-to-line-to-neutral fault or a line-to-neutral fault causes the voltage on the shorted phase to decrease to a level less than the voltage on the non-shorted phases, resulting in an unbalanced fault. As a result, the average value of the output voltage will include a voltage ripple effect that is transmitted by armature reaction within generator 18 to exciter field winding 20 (referred to hereinafter as the "armature reaction voltage ripple"). In response to this voltage ripple, the DC link voltage increases in magnitude. In this situation, however, the proper response is not the immediate shut-down of the generator, but rather to allow the unbalanced fault to continue for a short amount of time. Typically, circuit breakers located downstream from generating system 10 will trip, thereby isolating the fault without requiring the shutdown of generating system 10.

The problem, therefore, is that two (or more) different types of faults share a common symptom: the increase in the magnitude of the DC link voltage. The present invention is therefore directed towards a control scheme that reduces or prevents entirely the increase in the DC link voltage caused by unbalanced short-circuit conditions. In addition, the present invention is directed to a simplified solution to the problem that does not require any changes to the hardware of generating system 10. Specifically, the present invention is directed to a control scheme that will cancel out or reduce the armature reaction voltage ripple on the exciter field winding 20, thereby preventing the increase of the DC link voltage in response to an unbalanced short-circuit fault. In this way, an unbalanced short-circuit fault will not result in a build-up of the DC link voltage that would otherwise cause controller 36 to shut-down generating system 10. In addition, the control scheme makes use of the monitored output voltage of generator 18 to generate a compensated signal that is used to counteract the armature reaction voltage ripple. In this way, the control scheme of the present invention prevents the build-up of DC link voltage as a result of unbalanced short-circuit faults, and prevents the untimely shutdown of generating system 10.

In particular, controller 36 monitors the output voltage (labeled $V_a$, $V_b$, and $V_c$) of generator 18 and (at least in one embodiment) the output current (labeled $I_a$, $I_b$, and $I_c$) of generator 18. The monitored output voltage is provided to a compensation loop that isolates and shapes voltage ripples, if any, within the monitored output voltage. The resulting compensated signal is provided to a voltage regulator that compares the signal to a reference value, and provides the error or difference to exciter field controller 38. In turn, exciter field controller 38 controls the excitation provided to exciter field winding 20. By properly shaping the ripple component within the monitored output voltage, the resulting excitation provided to the exciter field winding 20 will counteract or cancel armature reactions voltage ripple caused by unbalanced short-circuit conditions, thereby preventing the buildup of voltage on the DC link.

Figure 2B:
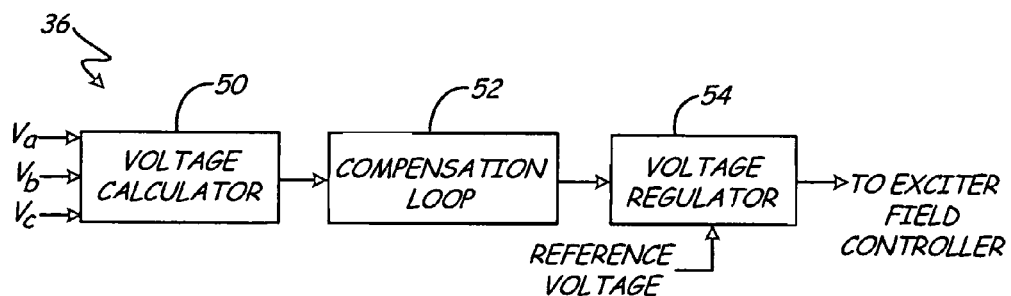

FIGS. 2A and 2B are block diagrams illustrating two exemplary embodiments of the operation of controller 36 in generating a compensated signal. Although shown as individual components in FIGS. 2A and 2B in an exemplary embodiment controller 36 comprises a digital signal processor (DSP) that executes software instructions to perform the functions described with respect to FIGS. 2A and 2B. A benefit of the present invention is in controllers that already include a DSP only changes to the software executed by the DSP are required to add the functionality of the present invention to an existing generator system. In other embodiments, other well-known digital signal processing or dedicated circuits may be used to perform the functions described with respect to FIGS. 2A and 2B.

As shown in FIG. 2A, controller 36 includes voltage calculator 40, unbalanced short-circuit detector 42, switches 44a and 44b, compensation loop 46, and voltage regulator 48. To detect whether or not an unbalanced short-circuit condition exists, unbalanced short-circuit detector 42 monitors the output currents $I_a$, $I_b$, and $I_c$ of generator 18. As discussed above, an unbalanced short-circuit is typically accompanied by the voltage at one or two phases of the generator output decreasing with respect to the other phases. In addition, the current associated with the phase of power on which the fault occurs will increase in magnitude. In an exemplary embodiment, detector 42 compares the monitored output current of each phase with a threshold value to determine whether a short-circuit condition exists on any of the monitored phases. Detection of an unbalanced short-circuit condition is conditioned on one or two, but not all three (for instance, in a three-phase system), of the monitored output currents exceeding the threshold value.

For instance, if monitored output current $I_a$ exceeds the threshold value, while monitored output currents $I_b$ and $I_c$ do not, then detector 42 determines that an unbalanced short-circuit condition exists. Similarly, if monitored output current $I_a$ and $I_b$ both exceed the threshold value, while monitored output current $I_c$ does not, then detector 42 once again determines that an unbalanced short-circuit condition exists. However, if all three monitored currents $I_a$, $I_b$, and $I_c$ exceed the threshold value then detector 42 determines that a short-circuit condition exists, but that the short-circuit condition is balanced rather than unbalanced. In this way, line-to-line short-circuit conditions, line-to-line-to-neutral and/or line-to-neutral short-circuit conditions can be differentiated from balanced short-circuit conditions in which all three phases are shorted. Although in this embodiment, the monitored output currents of generator 18 are employed to detect unbalanced short-circuit conditions, in other embodiments the monitored output voltage may be used either alone or in conjunction with the monitored output current to detect unbalanced short-circuit faults.

The monitored output voltages $V_a$, $V_b$, and $V_c$ of generator 18 are provided as input to voltage calculator 40, which calculates a steady-state or DC value representing the average magnitude of the monitored output voltages. The average output voltage may be the root mean square, average mean square, rectified output of the monitored AC output voltages, or any other well known method of representing the average magnitude of an AC output voltage.

In this embodiment, depending on the determination made by unbalanced short-circuit detector 42, the average voltage value detected by voltage calculation 40 is either provided as an input, to compensation loop 46 or voltage regulator 48. A determination by detector 42 that no unbalanced short-circuit condition exists results in the average voltage value being supplied (via switch 44a) directly to voltage regulator 48, which compares the average voltage value to a reference value. The resulting error signal is provided as an input to exciter field controller 38 (shown in FIG. 1). As discussed above, based on the provided error signal, exciter field controller 38 controls the excitation provided to exciter field winding 16, ultimately controlling the output voltage of generator 18.

A determination by detector 42 that an unbalanced short-circuit condition exists results in the average voltage value being provided (via switch 44b) as an input to compensation loop 46. The presence of an unbalanced short-circuit condition will create a voltage ripple within the average voltage value. Compensation loop 46 identifies the voltage ripple within the average voltage value, and modifies the phase and magnitude of the identified voltage ripple. As a result of these functions, a compensated signal is provided as an input to voltage regulator 48. The compensated signal will include a DC component that represents the average voltage value of the monitored output voltage and an AC component that is a result of the "shaping" functions applied to the voltage ripple component by compensation loop 46.

Voltage regulator 48 compares the compensated signal provided by compensation loop 46 to a reference value, and the resulting error signal is provided as an input to exciter field controller 38. By properly shaping the phase and magnitude of the voltage ripple included within the compensated signal, the resulting excitation generated on exciter field winding 20 will include a ripple component properly phased to counteract or cancel the armature reaction voltage ripple that would otherwise cause the DC link voltage to build-up.

FIG. 2B illustrates another embodiment of controller 36 for generating a compensated signal that will cancel or counteract an armature reaction voltage signal generated as a result of an unbalanced short-circuit fault. In contrast with the controller illustrated in FIG. 2A, which only applies compensation loop 46 in response to a detected unbalanced short-circuit fault, the embodiment of controller 36 shown in FIG. 2 applies compensation loop 52 to the average voltage value regardless of whether an unbalanced short-circuit fault has been detected. Once again, compensation loop 52 acts to isolate voltage ripple within the average voltage value provided by voltage calculator 50. In situations in which no unbalanced short-circuit fault exists, no voltage ripple will be present within the average voltage value. As a result, compensation loop 52 should have no effect on the monitored output voltage. However, if an unbalanced short-circuit conditions is present such that a voltage ripple exists within the monitored output voltage, compensation loop 52 will act to identify and shape the voltage ripple within the average voltage value.

As discussed with respect to FIG. 2A, the compensated signal is provided as an input to voltage regulator 54, which compares the compensated signal to a reference value to calculate an error value. As discussed above, the error value is provided to exciter winding controller 38 (shown in FIG. 1). By properly shaping the phase and magnitude of the voltage ripple included within the compensated signal, exciter winding controller 38 causes the excitation provided to exciter field winding 20 to include a ripple component properly phased to counteract or cancel the armature reaction voltage ripple that would otherwise cause the DC link voltage to build-up.

Figure 3:
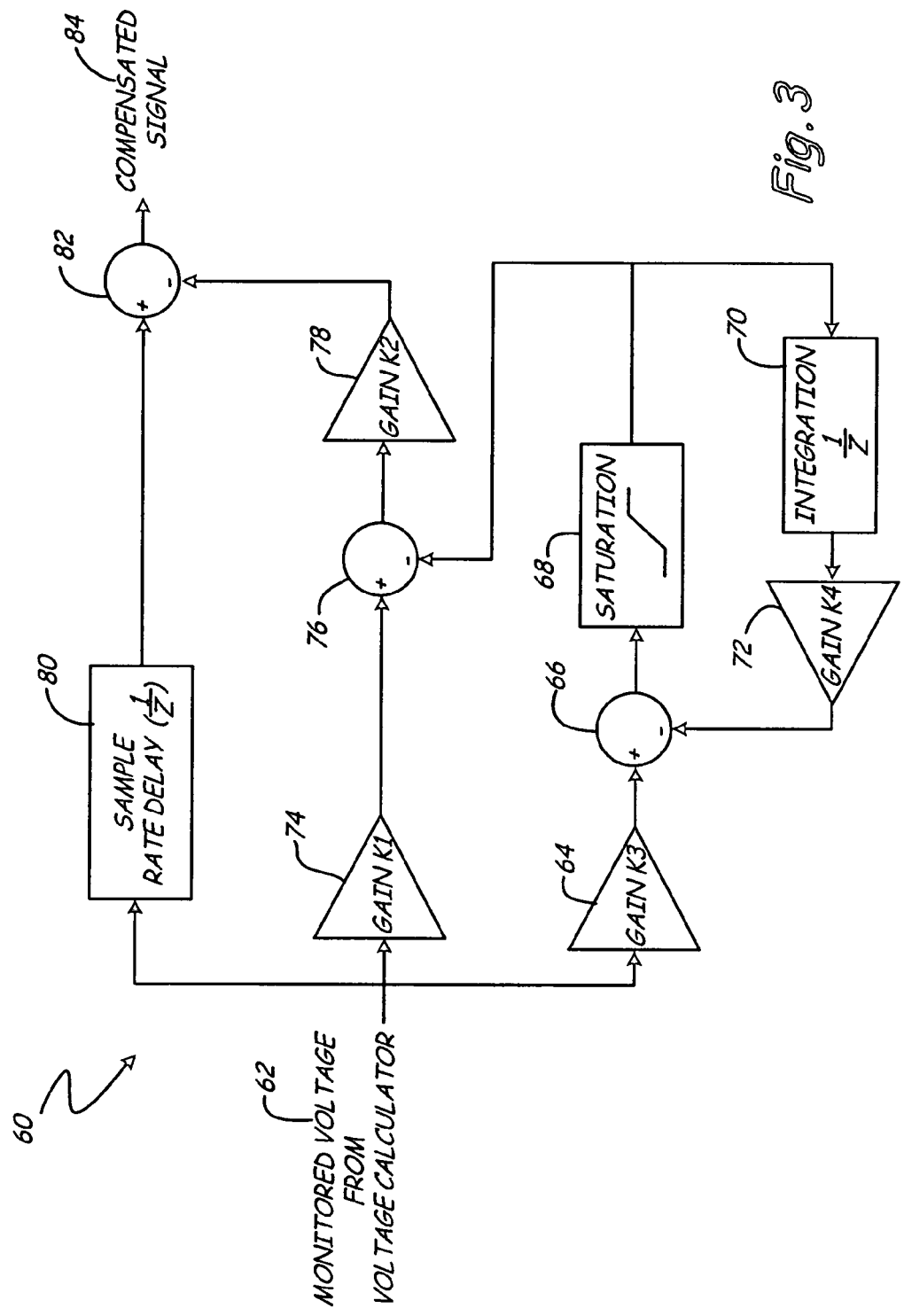
FIG. 3 is a block diagram of a compensation loop employed, by the controller of the present invention to provide the proper shaping of the monitored output voltage such that application of the resulting compensated signal prevents the buildup of DC link voltage.

FIG. 3 is a block diagram illustrating an exemplary embodiment of a compensation loop 60 implemented by controller 36 to prevent the buildup of voltage on the DC link caused by an unbalanced fault condition. Compensation loop 60 may be employed in either of the embodiments described with respect to FIGS. 2A and 2B. The embodiment shown in FIG. 3 illustrates one method of providing the proper filtering, phase shifting and gain application to the detected ripple voltage such that the compensated signal generated as a result of compensation loop 60 can be used to cancel the armature reaction voltage ripple. Other configurations of control functions may be employed to provide the proper filtering, phase shifting, and gain application to a detected voltage ripple.

In particular, compensation loop 60 includes as an input the average voltage 62, gain block 64, summer block 66, saturation block 68, integration block 70, gain block 72, gain block 74, summer block 76, gain block 78, sample rate delay block 80, summer block 82 and compensated signal 84. Compensation loop 60 may be applied to the average voltage value only in response to a detected unbalanced short-circuit fault (as shown in FIG. 2A) or may be applied to the average voltage value regardless of whether an unbalanced short-circuit has been detected (as shown in FIG. 2B).

The average voltage value is provided as an input to the compensation loop 60. An unbalanced short-circuit fault will generate a voltage ripple in the average voltage value, which compensation loop 60 seeks to identify and shape such that the resulting compensated signal includes a voltage ripple component that has a phase and magnitude that will cancel the armature reaction ripple voltage on the exciter field windings 20. In one embodiment, the transfer function can be described by the following equation;

$$\frac{K \cdot (S + Z)}{S + P} \qquad \text{Equation 1}$$

wherein K represents a gain value, Z represents the zero of the transfer function, and P represents the pole of the transfer function. The particular form and values of the transfer function may vary depending on the specifics of the application, but the goal of providing a compensated signal that provides an AC or ripple component properly phased to counteract the effects of armature reaction remains the same.

In the embodiment shown in FIG. 3, the filtering and phase shifting of the average voltage value is provided by gain block 64, summer block 66, saturation block 68, integration block 70 and gain block 72. The filtering function isolates the voltage ripple component within the average voltage value. The phase shift function modifies the phase of the isolated, voltage ripple component such that the phase of the compensation signal is designed to cancel out the armature reaction voltage ripple generated on exciter stator windings 20. The gain function scales the magnitude of the ripple component such that the compensated signal has an AC component of sufficient magnitude to cancel the armature reaction voltage ripple.

As a result of these functions, the output of compensation loop 60 (i.e., compensated signal 84) is properly shaped (in phase and magnitude) to counteract the armature reaction voltage ripple transmitted by way of armature reaction through generator 18 to exciter field windings 20. For example, in an exemplary embodiment the compensated signal 84 is shaped such that it is a desired number of degrees out of phase with the armature reaction voltage ripple. In this way, the compensated signal is phased such that when applied to exciter field windings 20, it acts to cancel out the armature reaction voltage ripple.

Therefore, the present invention provides a method and system for preventing a voltage build-up in the DC link voltage as a result of an unbalanced short-circuit faults. In particular, this allows for the differentiation between faults that require the shut-down of the generator (e.g., rotating rectifier diode faults) and unbalanced short-circuit faults which do not require the shutdown of the generator. Furthermore, the present invention does not require any changes to the design of the generator, and can be implemented as part of the controller in either software or programmable hardware logic.

Although the present invention has been described with reference to preferred embodiments, workers skilled in the art will recognize that changes may be made in form and detail without departing from the spirit and scope of the invention.

The invention claimed is:

1. A controller for use in a synchronous generator that includes an exciter field winding, an exciter armature winding, a main field winding and a main armature winding, the controller comprising:

a first input-operably connected to monitor output voltages of the generator;

a voltage calculator operably connected to the first input for calculating an average voltage value based on the monitored output voltages;

a control loop operably connected to the voltage calculator for generating a compensated signal based on the average voltage value, wherein in response to an unbalanced short-circuit condition the control loop identifies and modifies a voltage ripple component within the average voltage value to generate a compensated signal; and an output operably connected to control excitation provided to the exciter field winding based on the compensated signal provided to the control loop, wherein the compensated signal counteracts armature reaction voltage ripples generated as a result of an unbalanced short-circuit fault.

2. The controller of claim 1, further including:

a second input operably connected to monitor output currents of the generator;

a detector that detects unbalanced short-circuit fault based on the monitored output currents of the generator, wherein the detection circuit selectively applies the control loop to the monitored output voltage when an unbalanced short-circuit fault is detected.

3. The detection circuit of claim 2, wherein the detection circuit compares each phase of the monitored output currents to a threshold value to detect short-circuit conditions.

4. The detection circuit of claim 3, wherein the detection circuit determines that a short-circuit condition is unbalanced when one or more, but not all, of the monitored output currents indicate a short-circuit condition.

5. The controller of claim 1, further including a voltage calculator operably connected to the first inputs to calculate an average value representative of the monitored output voltage.

6. The controller of claim 5, wherein the control loop includes a filter for isolating alternating current (AC) content from the average voltage value to obtain a voltage ripple signal caused by the unbalanced short-circuit fault condition.

7. The controller of claim 6, wherein the control loop includes a phase compensator for applying a phase shift to the voltage ripple signal.

8. The controller of claim 7, wherein the control loop includes a gain compensator for applying a gain to the phase-shifted voltage ripple signal to generate the compensated signal.

9. A method of preventing a build-up of voltage on a DC link connected to an exciter field winding of a generator as a result of an unbalanced short-circuit fault at an output of the generator, the method comprising:

monitoring each phase of output voltage generated by the generator;

calculating an average voltage value based on the monitored output voltage;

applying a control loop that detects and modifies a voltage ripple component detected within the average voltage value to generate a compensated signal; and applying the compensated signal to the exciter field winding to counteract an armature reaction voltage ripple generated in response to the unbalanced short-circuit fault.

10. The method of claim 9, wherein applying the control loop includes:

monitoring each phase of output current generated by the generator; and detecting an unbalanced short-circuit condition based on the monitored output current of the generator, wherein the control loop is selectively applied to the average voltage value in response to a detected unbalanced short-circuit condition.

11. The method of claim 10, wherein detecting an unbalanced short-circuit condition includes:

comparing each phase of the monitored output currents to a threshold value to detect whether a short-circuit condition exists on the monitored phase;

determining that an unbalanced short-circuit condition exists when a short-circuit condition exists on one or more, but not all, of the monitored output currents.

12. The method of claim 9, further including converting the monitored output voltage to an averaged voltage value based on the monitored output voltage.

13. The method of claim 12, wherein applying the control loop to the monitored output voltage includes:

detecting a voltage ripple signal in the average voltage value;

applying a phase shift to the voltage ripple signal; and applying a gain to the phase-shifted voltage ripple signal to generate the compensated signal.

14. A synchronous generator comprising:

an input for receiving direct current (DC) voltage from a DC source;

an exciter field winding;

exciter armature windings mounted on a rotatable shaft that is magnetically coupled to the exciter field winding such that the DC current provided to the exciter field winding induces an alternating current (AC) voltage in the exciter armature windings;

a rotating rectifier mounted on the rotatable shaft and operably connected to the exciter armature windings to convert the AC voltage generated on the exciter armature windings to a DC voltage;

a main field winding mounted on the rotatable shaft and operably connected to receive the DC voltage generated by the rotating rectifier;

main armature windings magnetically coupled to the main field winding such that the DC voltage provided to the main field winding induces an AC output voltage in the main armature windings;

a controller having a first input operably connected to monitor the AC output voltage generated by the main armature windings and to apply a control loop to the monitored output voltage that detects and modifies the monitored output voltage to generate a compensated signal; wherein the controller employs the compensated signal to control the excitation provided to the exciter field winding to minimize armature reaction ripple voltage caused by unbalanced short-circuit conditions.

15. The synchronous generator of claim 14, wherein the controller includes:

a second input operably connected to monitored the AC output current generated by the main armature windings; and a detector operably connected to the second input that detects unbalanced short-circuit faults based on the monitored output currents of the generator, wherein the detector causes the control loop to be selectively applied in response to a detected unbalanced short-circuit fault.

16. The synchronous generator of claim 15, wherein the detector detects an unbalanced short-circuit condition when one or more, but not all, of the monitored currents exceed the threshold value.

17. The synchronous generator of claim 14, wherein the controller computes an average voltage value representative of the monitored AC output voltage and provides the average voltage signal as an input to the control loop.

18. The synchronous generator of claim 17, wherein the control loop includes a filter that is applied to the average voltage signal to isolate a voltage ripple caused by an unbalanced short-circuit fault.

19. The synchronous generator of claim 18, wherein the control loop includes a phase compensator for applying a phase shift to the voltage ripple signal.

20. The synchronous generator of claim 19, wherein the control loop includes a gain compensator for applying a gain to the phased shifted voltage ripple signal to generate the compensated signal.

21. A computer readable storage medium encoded with a machine-readable computer program code for generating thereof a compensated signal in response to a detected unbalanced fault condition, the computer readable storage medium including instructions for causing a controller to implement a method comprising:

acquiring input from one or more sensors positioned to monitor output voltage and output current of a generator;

detecting an unbalanced fault condition based on the monitored output current;

calculating an average mean squared voltage signal based on the monitored output voltage;

detecting a voltage ripple signal in the average mean squared voltage signal;

applying a phase shift to the voltage ripple signal;

applying a gain to the phase-shifted voltage ripple signal to generate the compensated signal; and providing as an output to a current loop controller for generating a desired current on an exciter field winding the compensated signal.

* * * * *